(12) United States Patent
Wu

(10) Patent No.: US 6,504,718 B2
(45) Date of Patent: Jan. 7, 2003

(54) SERVER HAVING AN AIR FLOW GUIDE DEVICE

(75) Inventor: Jeff Wu, Yungkang (TW)

(73) Assignee: Giga-Byte Technology Co., Ltd., Taipei Hsien (TW)

(*) Notice: Subject to any disclaimer, the term of this patent is extended or adjusted under 35 U.S.C. 154(b) by 0 days.

(21) Appl. No.: 09/950,649

(22) Filed: Sep. 13, 2001

(65) Prior Publication Data

US 2002/0054479 A1 May 9, 2002

(30) Foreign Application Priority Data

Nov. 6, 2000 (TW) .......................................... 089219263

(51) Int. Cl.⁷ ................................................ H05K 7/20
(52) U.S. Cl. ....................... 361/695; 361/690; 361/694; 174/15.1; 165/80.3; 165/104.33; 165/121; 454/184
(58) Field of Search ................................. 361/687, 690, 361/695, 697, 719–721; 165/80.2, 80.3, 104.33, 185; 174/16.3, 252, 254; 454/184

(56) References Cited

U.S. PATENT DOCUMENTS

| | | | | |
|---|---|---|---|---|
| 5,566,377 A | * | 10/1996 | Lee | 361/695 |
| 5,630,469 A | * | 5/1997 | Butterbaugh et al. | 165/80.3 |
| 6,031,720 A | * | 2/2000 | Crane, Jr. et al. | 361/695 |
| 6,113,485 A | * | 9/2000 | Marquis et al. | 454/184 |
| 6,236,565 B1 | * | 5/2001 | Gordon | 361/695 |
| 6,288,897 B1 | * | 9/2001 | Fritschle et al. | 361/687 |
| 6,364,009 B1 | * | 4/2002 | MacManus et al. | 165/185 |
| 6,377,459 B1 | * | 4/2002 | Gonsalves et al. | 361/700 |

* cited by examiner

*Primary Examiner*—Boris Chervinsky
(74) *Attorney, Agent, or Firm*—Rosenberg, Klein & Lee

(57) ABSTRACT

A server having an air flow guide device includes a support frame, a fan set mounted in the support frame, and an air flow guide device including a guide body mounted in the support frame and located behind the fan set. The guide body defines an air flow guide region. Thus, the air flow guide region of the guide body may guide and collect the air flow produced by operation of the fan set, so as to provide a heat dissipation effect to inner parts of the server.

6 Claims, 5 Drawing Sheets

US 6,504,718 B2

SERVER HAVING AN AIR FLOW GUIDE DEVICE

BACKGROUND OF THE INVENTION

1. Field of the Invention

The present invention relates to a server having an air flow guide device, and more particularly to a server having an air flow guide device that may be adapted to guide and collect the air flow produced by operation of the fan set, so as to provide a heat dissipation effect to the inner parts of the server.

2. Description of the Related Art

The server having the 1U specification is broadly employed in recent years. A conventional server in accordance with the prior art may comprise two central processing units (CPU), and a fan set operated at a high speed for providing a heat dissipation effect to the central processing units.

However, the fans of the fan set are spaced apart from each other with a determined distance, such that they cannot entirely achieve the heat dissipation effect to the parts inside the server. The central processing units of the main board are often mounted adjacent to the rear end of the server, so that the fan set can only achieve a little heat dissipation effect to the two central processing units of the server. In addition, the heated air flow is often retarded by the heat dissipation fins to remain in the inside of the server, thereby greatly affecting the heat dissipation effect. Further, gaps are formed between the periphery of the support rack for supporting the fan set and the support frame of the server, so that the fan set is not operated at a closed state. Thus, when the fan set is operated to suck the air flow from the front end of the server, the air flow from the rear end of the server will enter the front end of the server through the gaps, the phenomenon of a return flow will occur inside the server, thereby seriously influencing the heat dissipation effect.

SUMMARY OF THE INVENTION

The present invention has arisen to mitigate and/or obviate the disadvantage of the conventional server.

The primary objective of the present invention is to provide a server having an air flow guide device that may be adapted to guide and collect the air flow produced by operation of the fan set, so as to provide a heat dissipation effect to the inner parts of the server.

Another objective of the present invention is to provide a server having an air flow guide device that may be adapted to accelerate the velocity of the air flow to carry the heated air flow outward from the server.

In accordance with the present invention, there is provided a server having an air flow guide device, comprising:

a support frame;

a fan set mounted in the support frame; and an air flow guide device including a guide body mounted in the support frame and located behind the fan set.

The guide body defines an air flow guide region. Thus, the air flow guide region of the guide body may guide and collect the air flow produced by operation of the fan set, so as to provide a heat dissipation effect to inner parts of the server.

The guide body has a first guide portion formed with an air inlet facing the fan set, and a second guide portion formed with an air outlet facing a rear end of the support frame. The dimension of the guide body is gradually reduced from the air inlet of the first guide portion to the air outlet of the second guide portion. Thus, when the air flows from the air inlet of the first guide portion to the air outlet of the second guide portion, the air flow may be compressed, thereby increasing the velocity of the air flow, so that the heated air flow from the central processing unit on the main board of the server may be quickly carried outward from the air outlet of the guide body and the rear end of the support frame of the server.

The guide body has a closed inner portion defining an air flow guide region.

Preferably, the guide body is secured on a main board of the server, thereby defining a closed air flow guide region between the guide body and the main board of the server.

The air flow guide device further includes a sealing strip mounted on a periphery of the guide body and rested on the main board of the server, thereby providing a sealing effect between the guide body and the main board of the server.

The air flow guide device further includes a baffle mounted in the second guide portion of the guide body, and an auxiliary member mounted on the baffle.

The air flow guide device further includes multiple reinforcement ribs mounted in the guide body for reinforcing a strength of the guide body.

Further benefits and advantages of the present invention will become apparent after a careful reading of the detailed description with appropriate reference to the accompanying drawings.

DETAILED DESCRIPTION OF THE INVENTION

Figure 1:
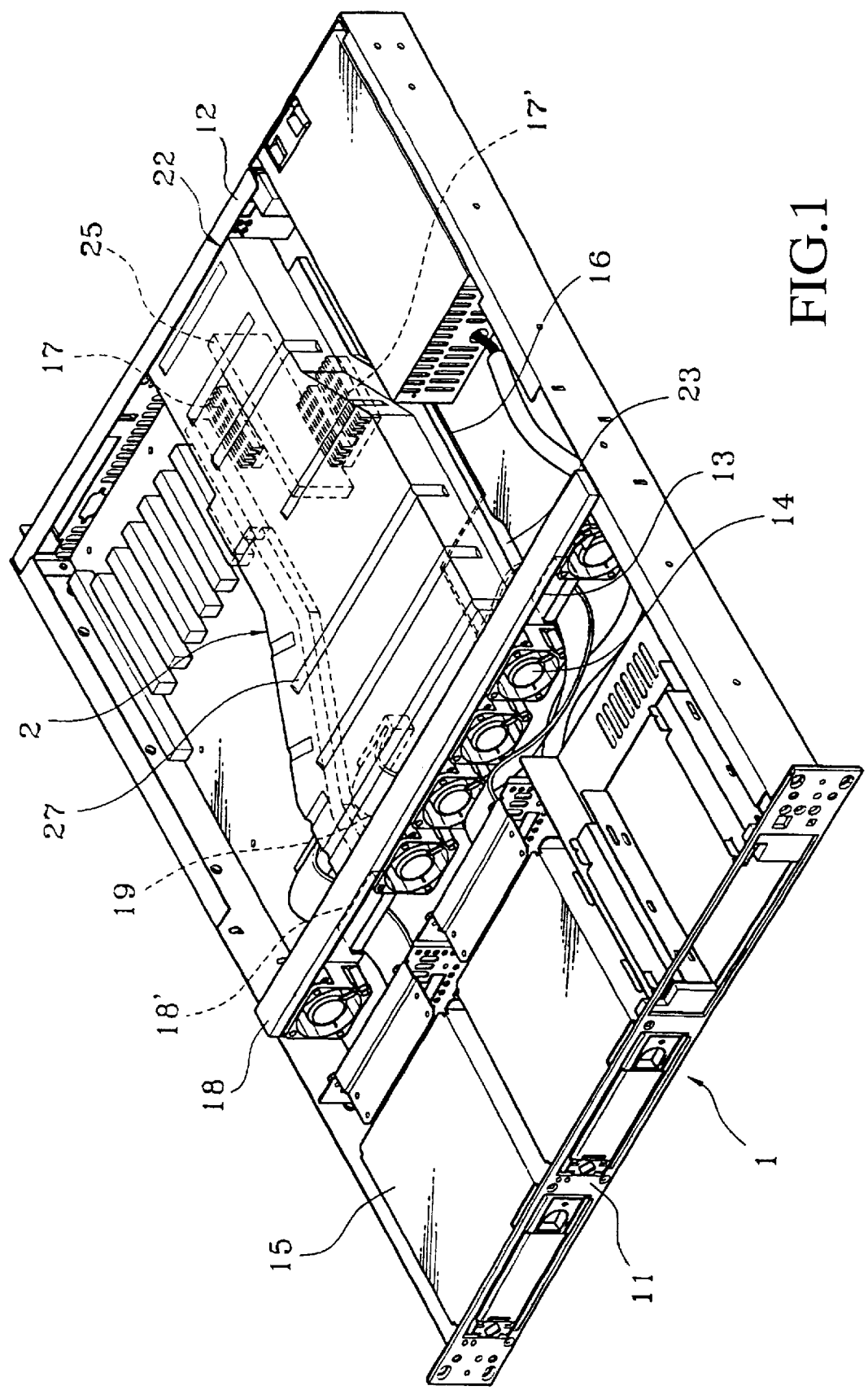
FIG. 1 is a perspective view of a server having an air flow guide device in accordance with a first embodiment of the present invention.
Figure 2:
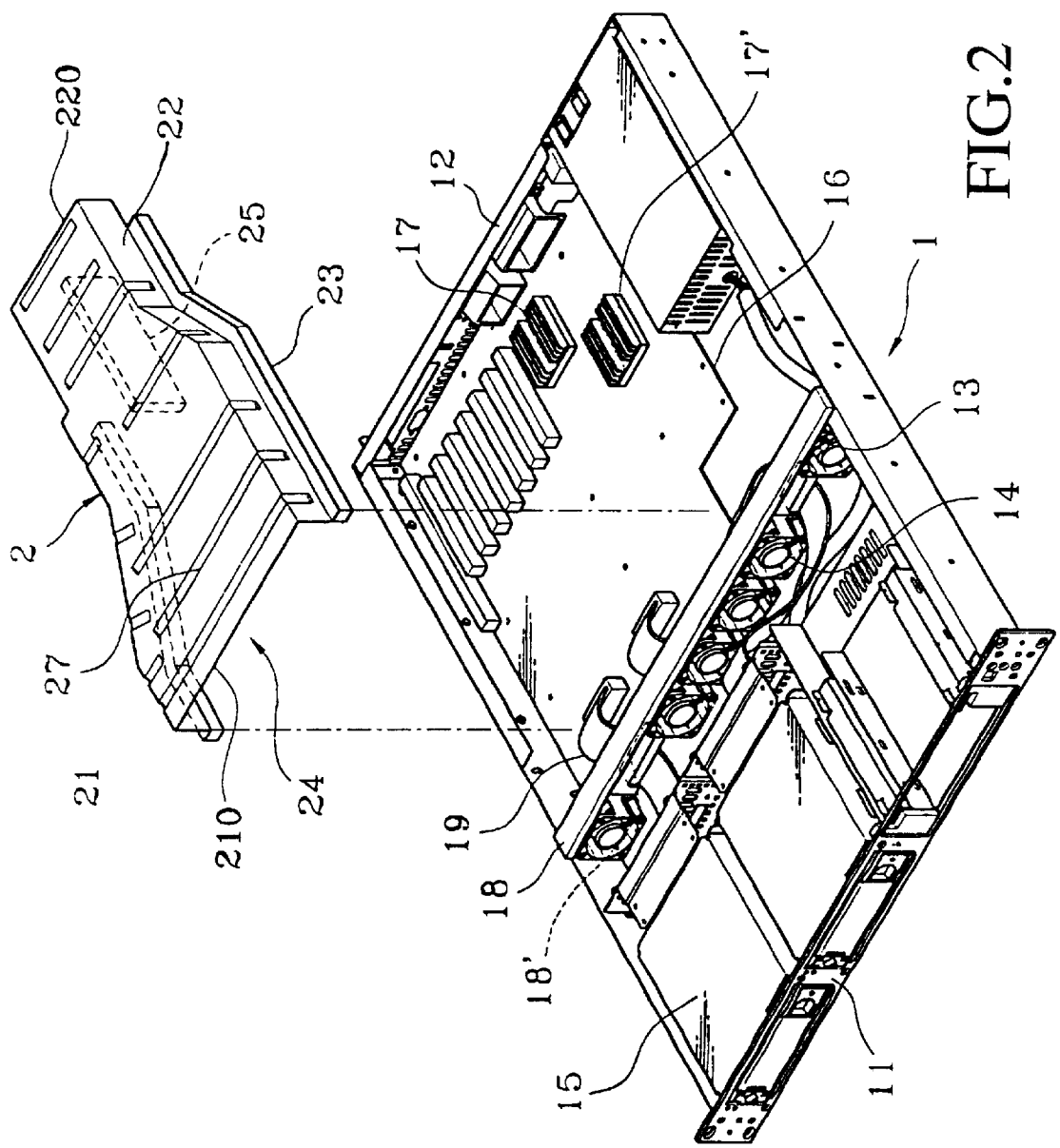
FIG. 2 is an exploded perspective view of the server having an air flow guide device as shown in FIG. 1.

Referring to the drawings and initially to FIGS. 1–4, a server having an air flow guide device in accordance with a first embodiment of the present invention comprises a support frame 1 having a front end 11 and a rear end 12, a support rack 13 mounted in the support frame 1 between the front end 11 and the rear end 12 for supporting a fan set 14, multiple hard disks 15 mounted in the support frame 1 near the front end 11, a main board 16 mounted in the support frame 1 near the rear end 12, two central processing units (CPU) 17 and 17' mounted on the main board 16, and multiple connecting wires 19 connected between the hard disks 15 and the main board 16.

The air flow guide device is connected to the fan set 14 of the server to guide and collect the air flow produced by operation of the fan set 14, so as to provide a heat dissipation effect to the inner parts of the server.

The air flow guide device includes a guide body 2 secured on the main board 16 of the server, thereby defining a closed air flow guide region 24 between the guide body 2 and the main board 16 of the server. The guide body 2 has a first guide portion 21 formed with an air inlet 210 facing the fan set 14 of the server, and a second guide portion 22 formed with an air outlet 220 facing the rear end 12 of the support frame 1 of the server. The dimension of the guide body 2 is gradually reduced from the air inlet 210 of the first guide portion 21 to the air outlet 220 of the second guide portion 22. The guide body 2 has a periphery provided with a sealing strip 23 rested on the main board 16 of the server, thereby providing a sealing effect between the guide body 2 and the main board 16 of the server. A plurality of reinforcement ribs 27 are in turn mounted in the guide body 2 for reinforcing the strength of the guide body 2.

The support rack 13 of the server is provided with airtight members 18 and 18', such that the rear end 12 of the support frame 1 of the server is separated from the front end 11 of the support frame 1 of the server in a closed manner. In addition, the front end 11 of the support frame 1 of the server is provided with air vents or gaps (not shown), to allow entrance of air into the support frame of the server. Thus, the air flow contained in the front end 11 of the support frame 1 of the server is sucked through the fan set 14 to enter the air flow guide region 24 of the guide body 2, such that the air flow produced by operation of the fan set 14 is guided and collected in the air flow guide region 24 of the guide body 2, so as to provide a heat dissipation effect to the inner parts (such as the central processing units 17 and 17') of the server. In addition, the air flow in the air flow guide region 24 of the guide body 2 may be accelerated in the second guide portion 22 of the guide body 2 due to the reduced dimension of the second guide portion 22 of the guide body 2, so that the heated air flow may be quickly carried outward from the rear end 12 of the support frame 1 of the server.

Figure 3:
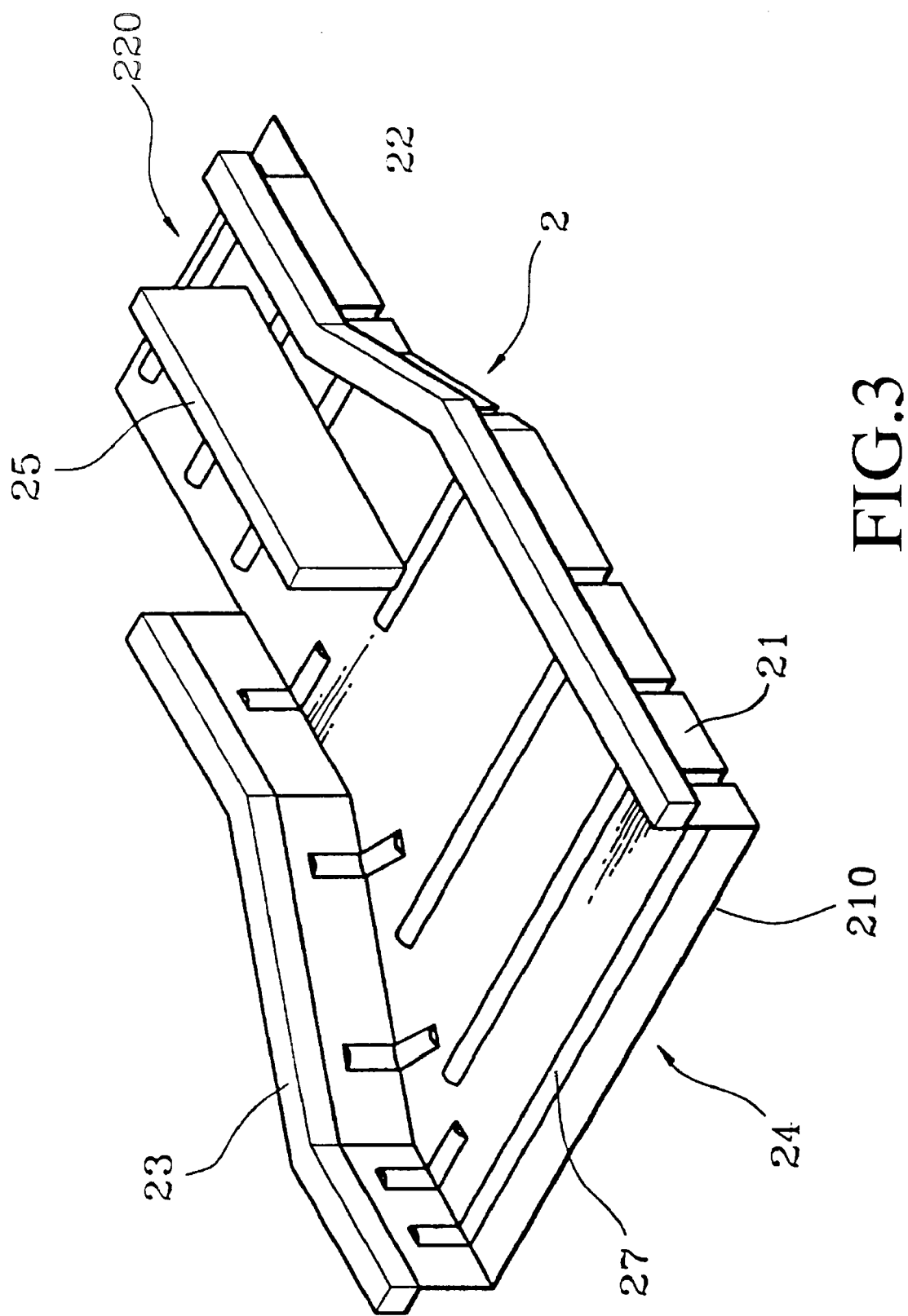
FIG. 3 is a bottom perspective view of a body of the server having an air flow guide device as shown in FIG. 1.

Especially referring to FIGS. 1 and 3, a baffle 25 is mounted in the second guide portion 22 of the guide body 2, and is located between the two central processing units 17 and 17' of the server, so as to divide the air flow guide region 24 of the guide body 2, thereby preventing the temperature of the two central processing units 17 and 17' of the server from influencing each other.

Figure 4:
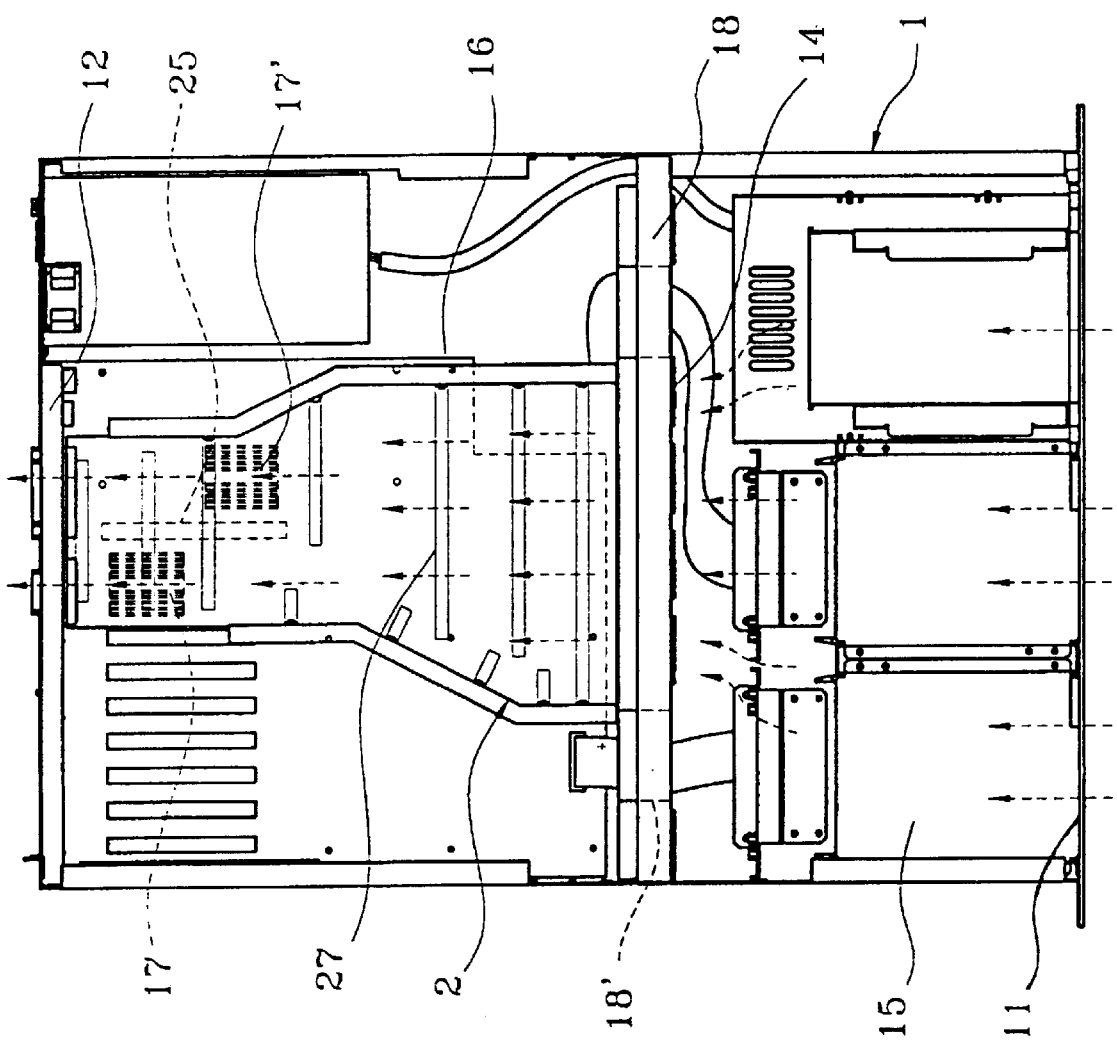
FIG. 4 is a cut-away top plan view of the server having an air flow guide device as shown in FIG. 1.

FIG. 4 clearly shows the flow direction of the air flow of the present invention. The front end 11 and the rear end 12 of the support frame 1 of the server may be exactly closed and separated from each other by the two airtight members 18 and 18' on the support rack 13 except the region of the fan set 14, so that the air flow from the front end 11 of the support frame 1 of the server has to pass through the fan set 14 to enter the rear end 12 of the support frame 1 of the server.

The front end 11 of the support frame 1 of the server is connected to the surrounding environment. When the fan set 14 is operated at a high speed, the cool air in the surrounding environment is sucked into the front end 11 of the support frame 1 of the server, thereby providing a heat dissipation effect to the parts (such as the hard disks 15) in the front end 11 of the support frame 1 of the server.

Then, the air flow contained in the front end 11 of the support frame 1 of the server is sucked and drawn through the fan set 14 and the air inlet 210 of the guide body 2 to enter the air flow guide region 24 of the guide body 2, such that the air flow may be guided and collected in the air flow guide region 24 of the guide body 2, so as to provide a heat dissipation effect to the inner parts (such as the central processing units 17 and 17' on the main board 16) in the rear end 12 of the support frame 1 of the server. The guide body 2 may form a closed space by the sealing strip 23, thereby collecting the air flow, and thereby preventing the air flow from leaking outward, thereby enhancing the heat dissipation effect.

The dimension of the guide body 2 is gradually reduced from the air inlet 210 of the first guide portion 21 to the air outlet 220 of the second guide portion 22. Thus, when the air flows from the air inlet 210 of the first guide portion 21 to the air outlet 220 of the second guide portion 22, the air flow is compressed, thereby increasing the velocity of the air flow, so that the heated air flow from the central processing units 17 and 17' on the main board 16 of the server may be quickly carried outward from the air outlet of the guide body 2 and the rear end 12 of the support frame 1 of the server, thereby efficiently solving the heat dissipation problem of the 1U server.

The baffle 25 may be used to separate the two central processing units 17 and 17' of the server, thereby enhancing the heat dissipation effect of the air flow.

Figure 5:
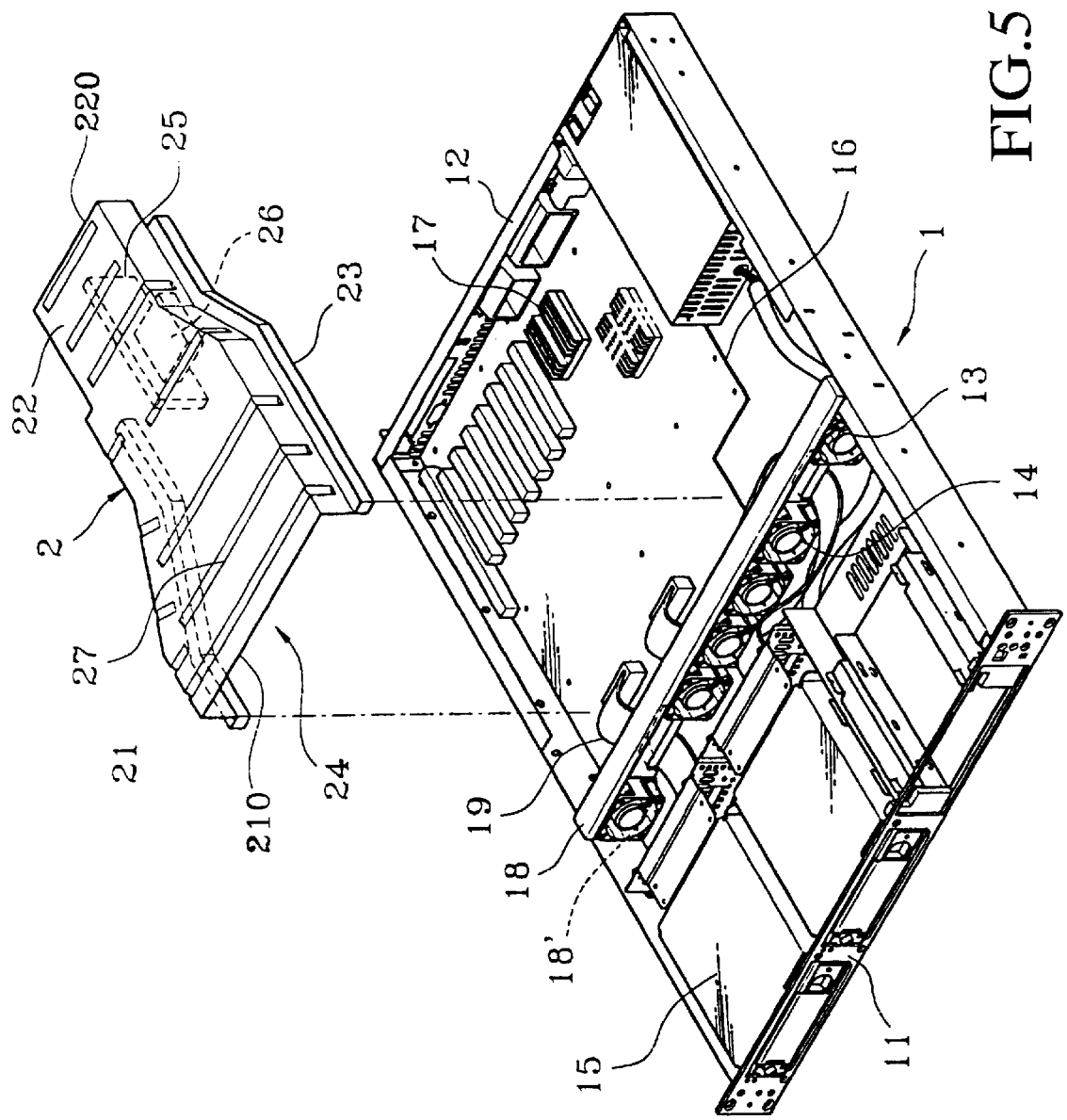
FIG. 5 is an exploded perspective view of a server having an air flow guide device in accordance with a second embodiment of the present invention.

Referring to FIG. 5, in accordance with a second embodiment of the present invention, only one central processing unit 17 is mounted on the support frame 1 of the server. An auxiliary member 26 is mounted on the baffle 25 to occupy the position of the central processing unit 17' of the server, thereby fully utilizing the air flow to provide the heat dissipation effect.

It is appreciated that, the sealing strip 23, the baffle 25, the auxiliary member 26, and the airtight members 18 and 18' are made of material that has the airtight and isolation features such as rubber, foam material or the like.

Although the invention has been explained in relation to its preferred embodiment as mentioned above, it is to be understood that many other possible modifications and variations can be made without departing from the scope of the present invention. It is, therefore, contemplated that the appended claim or claims will cover such modifications and variations that fall within the true scope of the invention.

What is claimed is:

1. A server having an air flow guide device, comprising:
   a support frame;
   a fan set mounted in said support frame; and
   an air flow guide device including a guide body mounted in said support frame and located behind said fan set, to guide and collect an air flow produced by operation of said fan set, so as to provide a heat dissipation effect to inner parts of said server; wherein:
      said guide body is secured on a main board of said server, thereby defining a closed air flow guide region between said guide body and said main board of said server; and
      said air flow guide device further includes a sealing strip mounted on a periphery of said guide body and rested on said main board of said server, thereby providing a sealing effect between said guide body and said main board of said server, and
      said air flow guide device further includes a baffle mounted in said second guide portion of said guide body.

2. The server having the air flow guide device in accordance with claim 1, wherein said guide body has a first guide portion formed with an air inlet facing said fan set, and a second guide portion formed with an air outlet facing a rear end of said support frame, and a dimension of said guide body is gradually reduced from said air inlet of said first guide portion to said air outlet of said second guide portion.

3. The server having the air flow guide device in accordance with claim 1, wherein said guide body has a closed inner portion defining an air flow guide region.

4. The server having the air flow guide device in accordance with claim 2, wherein said air flow guide device further includes an auxiliary member mounted on said baffle.

5. The server having the air flow guide device in accordance with claim 1, wherein said air flow guide device further includes a plurality of reinforcement ribs mounted in said guide body for reinforcing a strength of said guide body.

6. The server having the air flow guide device in accordance with claim 1, further comprising a support rack mounted in said support frame for supporting said fan set, and an airtight member mounted on said support rack.

* * * * *